(12) United States Patent
Woerner et al.

(10) Patent No.: US 11,494,532 B2
(45) Date of Patent: Nov. 8, 2022

(54) SIMULATION-BASED OPTIMIZATION ON A QUANTUM COMPUTER

(71) Applicant: International Business Machines Corporation, Armonk, NY (US)

(72) Inventors: Stefan Woerner, Zürich (CH); Christa Zoufal, Zürich (CH); Daniel Josef Egger, Thalwil (CH); Panagiotis Barkoutsos, Zürich (CH); Ivano Tavernelli, Wädenswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 528 days.

(21) Appl. No.: 16/443,127

(22) Filed: Jun. 17, 2019

(65) Prior Publication Data
US 2020/0394276 A1 Dec. 17, 2020

(51) Int. Cl.
*G06F 30/20* (2020.01)
*G06N 5/04* (2006.01)
*G06N 10/00* (2022.01)

(52) U.S. Cl.
CPC ............ *G06F 30/20* (2020.01); *G06N 5/045* (2013.01); *G06N 10/00* (2019.01)

(58) Field of Classification Search
CPC ......... G06F 30/20; G06N 10/00; G06N 5/045
USPC .................................................. 703/1, 2, 6
See application file for complete search history.

(56) References Cited

U.S. PATENT DOCUMENTS

| | | | |
|---|---|---|---|
| 2016/0314406 A1 | 10/2016 | Wiebe et al. | |
| 2017/0364796 A1* | 12/2017 | Wiebe | G06N 3/0445 |
| 2018/0096085 A1 | 4/2018 | Rubin | |
| 2018/0165601 A1 | 6/2018 | Wiebe et al. | |
| 2018/0232649 A1* | 8/2018 | Wiebe | G06F 17/16 |
| 2018/0307988 A1 | 10/2018 | Fano et al. | |
| 2019/0286774 A1* | 9/2019 | Nannicini | G06F 30/367 |
| 2019/0302107 A1* | 10/2019 | Kauffman | G16C 20/50 |
| 2021/0255856 A1* | 8/2021 | Cao | G06N 10/00 |

FOREIGN PATENT DOCUMENTS

WO  2017117016  7/2017

OTHER PUBLICATIONS

Rebentrost et al. (Quantum computational finance: Monte Carlo pricing of financial derivatives, (15 pages) (Year: 2018).*
Moseley, et al. "Bayesian Optimisation for variational quantum eigensolvers", https://pdrs.semanticscholar.org/c5f1/7d67dc1decdf73cce890e1a25a9062e68f28.pdf (2018).
Woerner, et al. "Quantum risk analysis", npj Quantum Information https://www.nature.com/articles/s41534-019-0130-6 (2019).

* cited by examiner

*Primary Examiner* — Andre Pierre Louis
(74) *Attorney, Agent, or Firm* — Amin, Turocy & Watson, LLP

(57) ABSTRACT

Techniques and a system to facilitate simulation-based optimization on a quantum computer are provided. In one example, a system includes a quantum processor. The quantum processor performs a quantum amplitude estimation process based on a probabilistic distribution associated with a decision-making problem. Furthermore, the quantum processor includes a simulator that simulates the decision-making problem based on the quantum amplitude estimation process.

18 Claims, 10 Drawing Sheets

SIMULATION-BASED OPTIMIZATION ON A QUANTUM COMPUTER

BACKGROUND

The subject disclosure relates to quantum computing and, more specifically, to optimization associated with a quantum computer.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products for facilitating simulation-based optimization on a quantum computer are described.

According to an embodiment, a system can comprise a quantum processor. The quantum processor can perform a quantum amplitude estimation process based on a probabilistic distribution associated with a decision-making problem. Furthermore, the quantum processor can comprise a simulator. The simulator can simulate the decision-making problem based on the quantum amplitude estimation process.

According to another embodiment, a computer-implemented method is provided. The computer-implemented method can comprise receiving, by a system operatively coupled to a processor, an objective function estimated by a quantum amplitude estimation process associated with a quantum processor. The computer-implemented method can also comprise performing, by the system, a classical optimization process based on the objective function to generate a continuous parameter for the quantum amplitude estimation process associated with the quantum processor.

According to yet another embodiment, a system can comprise a quantum processor and a classical processor. The quantum processor can perform a quantum amplitude estimation process based on a probabilistic distribution associated with a decision-making problem. The classical processor can optimize the decision-making problem using a classical optimization process based on a type of decision variables associated with the decision-making problem.

DETAILED DESCRIPTION

Figure 1:
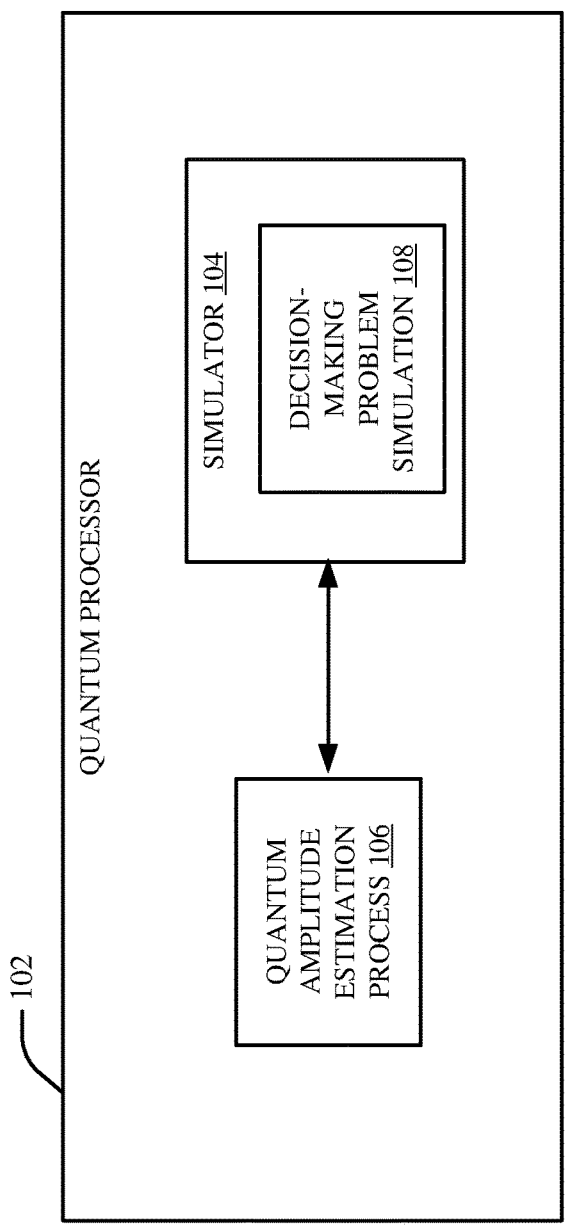
FIG. 1 illustrates a block diagram of an example, non-limiting system that facilitates simulation-based optimization on a quantum processor in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing employs quantum physics to encode information rather than binary digital techniques based on transistors. For example, a quantum computer can employ quantum bits (e.g., qubits) that operate according to a superposition principle of quantum physics and an entanglement principle of quantum physics. The superposition principle of quantum physics allows each qubit to represent both a value of "1" and a value of "0" at the same time. The entanglement principle of quantum physics states allows qubits in a superposition to be correlated with each other. For instance, a state of a first value (e.g., a value of "1" or a value of "0") can depend on a state of a second value. As such, a quantum computer can employ qubits to encode information rather than binary digital techniques based on transistors. However, it is generally desirable to optimize a quantum computer and/or a quantum computing process. As such, design of a quantum computer and/or quantum computing processing can be improved. In an example, a classical optimization approach can be employed to optimize a quantum computer. For instance, Monte Carlo simulation can be employed to approximate an expected value using an average of numerous samples. However, Monte Carlo simulation generally employs a vast number of samples to achieve a desired result.

To address these and/or other issues, embodiments described herein include systems, computer-implemented methods, and computer program products for simulation-based optimization on a quantum computer. In an aspect, quantum amplitude estimation can be employed to simulate a problem of interest for a set of parameters. For instance, quantum amplitude estimation can be performed on a quantum computer (e.g., a quantum processor, a quantum circuit, etc.) to simulate a problem of interest associated with a set of parameters (e.g., a set of variables). In an aspect, a parameterized operator for amplitude estimation can be constructed to simulate a problem of interest associated with a set of parameters (e.g., a set of variables). The set of parameters can include continuous parameters, discrete parameters and/or superpositions of discrete parameters. A problem of interest can be, for example, a decision-making problem. Quantum amplitude estimation can employ a probabilistic distribution of data associated with the problem of interest (e.g., the decision-making problem). For instance, parameters of the problem of interest (e.g., the decision-making problem) can be fit into an amplitude of a quantum state associated with a quantum processor. In an aspect, the quantum amplitude estimation can estimate probability of success associated with a quantum search algorithm for the problem of interest (e.g., the decision-making problem). In an example for a problem of interest associated with continuous decision variables, the continuous decision variables can be optimized via one or more classical optimization techniques. In an example for a problem of interest associated with discrete decision variables, a variational form of a quantum circuit (e.g., a parametrized quantum circuit) can be employed to map continuous parameters to quantum states where the qubits can represent a superposition of discrete decisions. As such, quantum amplitude estimation achieve a quadratic speedup as compared to other classical simulation techniques such as, for example, Monte Carlo simulation. Furthermore, in certain embodiments, a variational quantum eigensolver can be employed to process discrete decision variables. Accordingly, a number of samples for a quantum computing process and/or a simulation associated with a quantum processor can be reduced. Estimation error associated with a quantum computing process and/or a simulation associated with a quantum processor can also be reduced. Furthermore, speed of a quantum computing process and/or a simulation associated with a quantum processor can be improved. For example, an amount of time and/or an amount of computational resources to perform a quantum computing process and/or quantum simulation-based optimization of a simulation associated with a quantum processor can also be reduced. Efficiency of a simulation associated with a quantum processor can also be improved. Additionally, accuracy of a simulation associated with a quantum processor can be improved.

As disclosed herein, a classical processor (e.g., a classical computer, a classical circuit, etc.) can be a machine that processes data based on binary digits and/or transistors. Furthermore, a quantum processor (e.g., a quantum computer, a quantum circuit, etc.) as disclosed herein can be a machine that processes data based on quantum bits and/or quantum mechanical phenomena associated with superposition and/or entanglement.

FIG. 1 illustrates a block diagram of an example, non-limiting system 100 for simulation-based optimization on a quantum computer in accordance with one or more embodiments described herein. In various embodiments, the system 100 can be a quantum processing system associated with technologies such as, but not limited to, quantum computing technologies, quantum processing technologies, quantum circuit technologies, artificial intelligence technologies, machine learning technologies, search engine technologies, image recognition technologies, speech recognition technologies, model reduction technologies, iterative linear solver technologies, data mining technologies, healthcare technologies, pharmaceutical technologies, biotechnology technologies, finance technologies, chemistry technologies, material discovery technologies, vibration analysis technologies, geological technologies, aviation technologies, and/or other technologies. The system 100 can employ hardware and/or software to solve problems that are highly technical in nature, that are not abstract and that cannot be performed as a set of mental acts by a human. Further, in certain embodiments, some of the processes performed may be performed by one or more specialized computers (e.g., one or more specialized processing units, a specialized computer with a classical processor component, a quantum computer, etc.) for carrying out defined tasks related to quantum computing and/or simulation-based optimization of a quantum computer. The system 100 and/or components of the system 100 can be employed to solve new problems that arise through advancements in technologies mentioned above, computer architecture, quantum processing architecture and/or the like. One or more embodiments of the system 100 can provide technical improvements to quantum computing systems, quantum processing systems, quantum circuit systems, artificial intelligence systems, machine learning systems, search engine systems, image recognition systems, speech recognition systems, model reduction systems, iterative linear solver systems, data mining systems, healthcare systems, pharmaceutical systems, biotechnology systems, finance systems, chemistry systems, material discovery systems, vibration analysis systems, geological systems, aviation systems, and/or other systems. One or more embodiments of the system 100 can also provide technical improvements to a quantum computer (e.g., a quantum processor, a quantum circuit, etc.) by improving processing efficiency of the quantum computer, improving processing performance of the quantum computer, improving processing accuracy of the quantum computer, improving timing characteristics of the quantum computer and/or improving power efficiency of the quantum computer.

In the embodiment shown in FIG. 1, the system 100 can include a quantum processor 102. Furthermore, the quantum processor can include a simulator 104 that can employ a quantum amplitude estimation process to perform one or more simulations via a decision-making problem simulation 108. In certain embodiments, the decision-making problem simulation 108 can include the quantum amplitude estimation process 106. The quantum processor 102 can be a machine that performs a set of calculations based on principle of quantum physics. For instance, the quantum processor 102 can perform one or more quantum computations associated with a set of quantum gates. Furthermore, the quantum processor 102 can encode information using qubits. In an aspect, the quantum processor 102 can perform the quantum amplitude estimation process 106 to facilitate the decision-making problem simulation 108. For example, the quantum processor 102 can execute a set of instruction threads associated with the quantum amplitude estimation process 106. The quantum amplitude estimation process 106 can be, for example, a quantum algorithm that can achieve a quadratic speedup as compared to a classical algorithm. In an aspect, the quantum processor 102 can perform the quantum amplitude estimation process 106 based on a probabilistic distribution associated with a decision-making problem. For example, the quantum amplitude estimation process 106 can employ a probabilistic distribution of data associated with the decision-making problem. In certain embodiments, the quantum amplitude estimation process 106 can sample a probabilistic distribution of data associated with a decision-making problem. For instance, parameters of the decision-making problem can be fit into an amplitude of a quantum state associated with the quantum processor 102. In another aspect, the quantum amplitude estimation process 106 can estimate probability of success associated with a quantum search algorithm for the decision-making problem. The decision-making problem can be a maximization problem for a technological application. Alternatively, the decision-making problem can be a minimization problem for a technological application. A technological application associated with the decision-making problem can be a supply chain management application, a logistics application, a manufacturing application, a design application (e.g., a computer design application, a circuit design application, a product design application, etc.), a finance application, or another type of technological application. In an embodiment, the quantum amplitude estimation process 106 can determine an objective function associated with the decision-making problem. The objective function can be a relational expression related to a combination of variables, values and/or symbols that describe the decision-making problem. In an embodiment, the quantum amplitude estimation process 106 can estimate a minimum value or a maximum value associated with the objective function for the decision-making problem. In one example, the objective function can be a loss function (e.g., a cost function) for a quantum computing process associated with the quantum processor 102. Furthermore, the objective function can be associated with energy associated with the quantum processor 102. In another example, the objective function can be Hamiltonian value (e.g., a Hamiltonian data matrix) that encodes total energy of the quantum processor 102.

The simulator 104 can perform the decision-making problem simulation 108 via the quantum amplitude estimation process 106. For example, the decision-making problem simulation 108 of the simulator 104 can simulate and/or optimize the decision-making problem based on the quantum amplitude estimation process 106. In an aspect, a parameterized operator for the quantum amplitude estimation process 106 can be employed to simulate and/or optimize the decision-making problem via the decision-making problem simulation 108. In certain embodiments, the decision-making problem simulation 108 of the simulator 104 can simulate and/or optimize the decision-making problem using a classical optimization process (e.g., using data associated with a classical optimization process) based on a type of decision variables associated with the decision-making problem. For example, the decision-making problem simulation 108 of the simulator 104 can simulate and/or optimize the decision-making problem using a classical optimization process (e.g., using data associated with a classical optimization process) based on whether the decision-making problem is associated with discrete decision variables and/or continuous decision variables. A discrete decision variable can be associated with a binary decision (e.g., a first decision or a second decision) for the decision-making problem. A continuous decision variable can be associated with a non-binary decision (e.g., more than two possible decisions, approximately infinite number of possible decisions, etc.).

In an embodiment, the decision-making problem simulation 108 of the simulator 104 can simulate and/or optimize the decision-making problem using a classical optimization process (e.g., using data associated with a classical optimization process) in response to a determination that the decision-making problem is associated with continuous decision variables. In another embodiment, the decision-making problem simulation 108 of the simulator 104 can simulate and/or optimize the decision-making problem using data provided by a classical processing technique for combinatorial optimization in response to a determination that the decision-making problem is associated with integer decision variables. In yet another embodiment, the decision-making problem simulation 108 of the simulator 104 can simulate and/or optimize the decision-making problem using a hybrid quantum/classical variational process and a classical optimization process in response to a determination that the decision-making problem is associated with discrete decision variables. For example, the decision-making problem simulation 108 of the simulator 104 can simulate and/or optimize the decision-making problem using a variational quantum eigensolver and a classical optimization process in response to a determination that the decision-making problem is associated with discrete decision variables. In certain embodiments, the decision-making problem simulation 108 of the simulator 104 can simulate and/or optimize the decision-making problem using a classical optimization process (e.g., using data associated with a classical optimization process) to provide one or more parameters to the quantum amplitude estimation process 106. For example, the one or more parameters can include a parameterized operator for the quantum amplitude estimation process 106. In another example, the one or more parameters can include a parametrization of a quantum state associated with the quantum processor 102. For instance, the one or more parameters can include one or more values that correspond to a quantum state associated with the quantum processor 102 in order to maximize or minimize the objective function provided by the quantum amplitude estimation process 106. In certain embodiments, the decision-making problem simulation 108 of the simulator 104 can map continuous decision variables associated with the decision-making problem to respective quantum states of the quantum processor 102. For example, the decision-making problem simulation 108 of the simulator 104 can map continuous decision variables associated with the decision-making problem to a variational form (e.g., a variational quantum eigensolver) associated with qubits.

It is to be appreciated that the quantum processor 102 performs one or more quantum computation processes that cannot be performed by a human (e.g., is greater than the capability of a single human mind). For example, an amount of data processed, a speed of data processed and/or data types of data processed by the quantum processor 102 over a certain period of time can be greater, faster and different than an amount, speed and data type that can be processed by a single human mind over the same period of time. The quantum processor 102 can also be fully operational towards performing one or more other functions (e.g., fully powered on, fully executed, etc.) while also performing the above-referenced one or more quantum computation processes. Moreover, data generated by the quantum amplitude estimation process 106 and/or the decision-making problem simulation 108 can include information that is impossible to obtain manually by a user. For example, a type of information and/or a variety of information included in data generated by the quantum amplitude estimation process 106 and/or the decision-making problem simulation 108 can be more complex than information obtained manually by a user.

Additionally, it is to be appreciated that the system 100 can provide various advantages as compared to conventional quantum computation techniques. The system 100 can also provide various solutions to problems associated with conventional quantum computation techniques. For instance, an amount of time to perform a quantum computation process can be reduced by employing the system 100. Furthermore, an amount of computational resources employed to perform a quantum computation process can be reduced by employing the system 100. Accuracy of a quantum computation can also be improved by employing the system 100. Moreover, performance of the quantum processor 102 can be improved, efficiency of the quantum processor 102 can be improved, timing characteristics of the quantum processor 102 can be improved, power characteristics of the quantum processor 102 can be improved, and/or another characteristic of the quantum processor 102 can be improved by employing the system 100.

Figure 2:
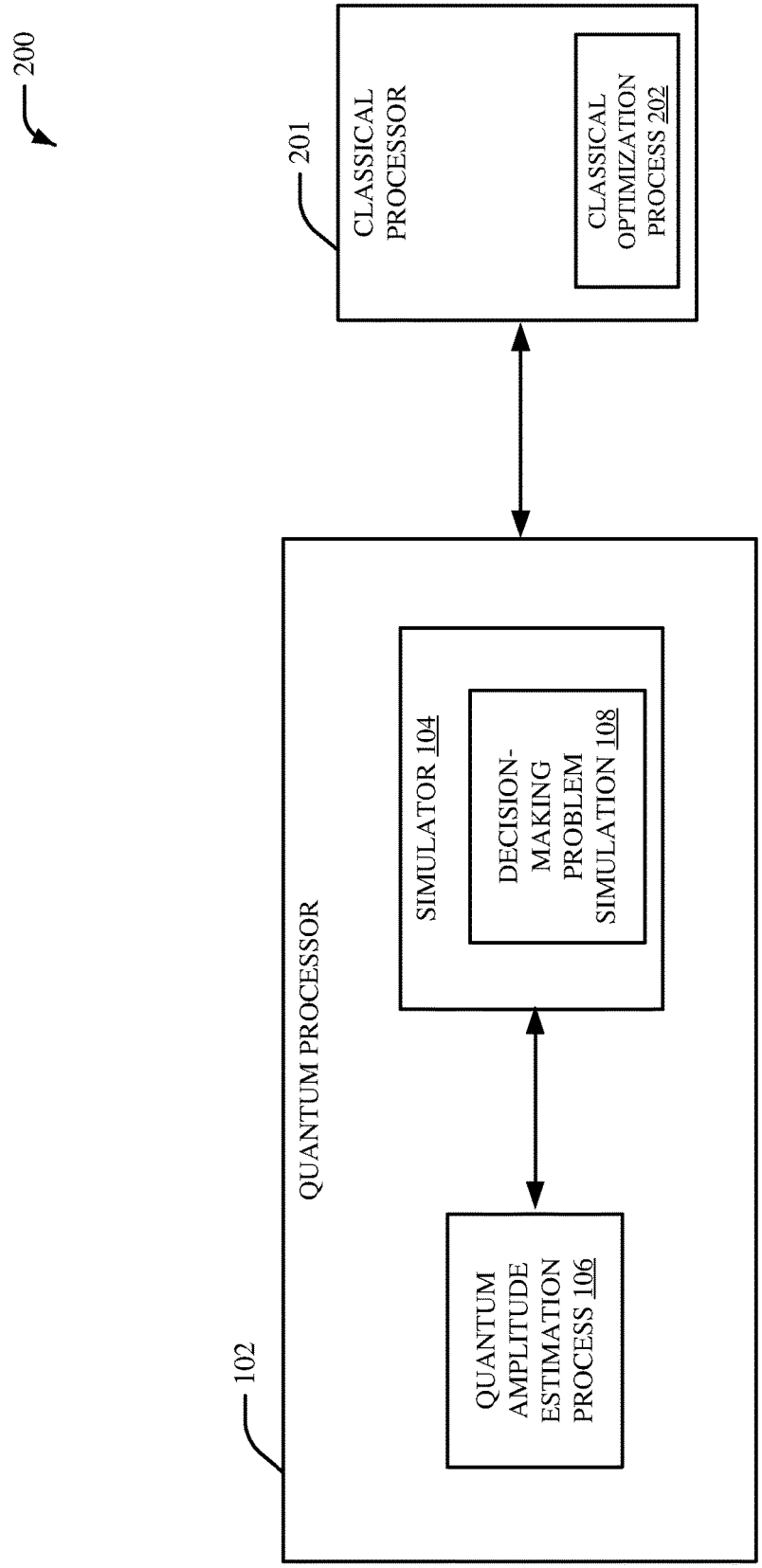
FIG. 2 illustrates a block diagram of another example, non-limiting system that facilitates simulation-based optimization on a quantum processor in accordance with one or more embodiments described herein.

FIG. 2 illustrates a block diagram of an example, non-limiting system 200 in accordance with one or more embodiments described herein. Repetitive description of like elements employed in other embodiments described herein is omitted for sake of brevity.

The system 200 can include the quantum processor 102 and a classical processor 201. The classical processor 201 can be communicatively coupled to the quantum processor 102. For example, the classical processor 201 can be communicatively coupled to the simulator 104. The classical processor 201 can receive data from the quantum amplitude estimation process 106 and/or the decision-making problem simulation 108. Furthermore, the classical processor 201 can provide data to the quantum amplitude estimation process 106 and/or the decision-making problem simulation 108. In an embodiment, the quantum processor can include the simulator 104. The quantum processor 102 can also perform the quantum amplitude estimation process 106. Furthermore, the simulator 104 can perform the decision-making problem simulation 108. The classical processor 201 can perform a classical optimization process 202. The classical processor 201 can be a machine that performs a set of calculations based on binary digits and/or transistors. The classical processor 201 can be, for example, a classical optimizer. In an aspect, the classical optimization process 202 can employ one or more classical computation techniques to facilitate simulation-based optimization of data for the decision-making problem solved by the quantum processor 102. For example, the classical optimization process 202 can employ linear programming for a linear objective function associated with the decision-making problem solved by the quantum processor 102, nonlinear programming for a nonlinear objective function associated with the decision-making problem solved by the quantum processor 102, integer programming that constrains variables to integers for an objective function associated with the decision-making problem solved by the quantum processor 102, quadratic programming that provides quadratic results for an objective function associated with the decision-making problem solved by the quantum processor 102, stochastic programming associated with random variables for the decision-making problem solved by the quantum processor 102, dynamic programming associated with a set of sub-problem processes related to respective different portions of the decision-making problem solved by the quantum processor 102, and/or another type of classical optimization technique to facilitate simulation-based optimization of data for the decision-making problem solved by the quantum processor 102. In certain embodiments, the classical optimization process 202 can employ one or more derivative free optimization techniques, a template based pattern search, derivative based optimization, mixed integer non-linear programming and/or another classical optimization technique to optimize data provided by the quantum processor 102. In an aspect, the classical optimization process 202 can optimize data provided by the quantum processor 102 (e.g., the quantum amplitude estimation process 106 of the quantum processor 102) to determine variational parametrization (e.g., a continuous parameter) associated with the data. For instance, based on the objective function provided by the quantum amplitude estimation process 106, the classical optimization process 202 can determine a set of variational parameters for the quantum processor 102. In an example, the classical optimization process 202 can determine a set of variational parameters for a hybrid quantum/classical variational process (e.g., a variational quantum eigensolver) of the quantum processor 102. In another aspect, the classical optimization process 202 can perform an iterative optimization process to facilitate simulation-based optimization of data for the decision-making problem solved by the quantum processor 102. For example, the classical optimization process 202 can perform an iterative optimization process to determine a maximum value or a minimum value for a solution associated with simulation-based optimization of data for the decision-making problem solved by the quantum processor 102.

In certain embodiments, the classical optimization process 202 can employ a probabilistic and/or statistical-based analysis (e.g., factoring into the analysis utilities and costs) to learn and/or generate inferences with respect to data provided by the quantum amplitude estimation process 106. In an aspect, the classical optimization process 202 can include an inference component (not shown) that can further enhance aspects of the decision-making problem simulation 108 utilizing in part inference based schemes to facilitate learning and/or generating inferences associated with data provided by the quantum amplitude estimation process 106. The classical optimization process 202 can employ any suitable machine-learning based techniques, statistical-based techniques and/or probabilistic-based techniques. For example, the classical optimization process 202 can employ expert systems, fuzzy logic, SVMs, Hidden Markov Models (HMMs), greedy search algorithms, rule-based systems, Bayesian models (e.g., Bayesian networks), neural networks, other non-linear training techniques, data fusion, utility-based analytical systems, systems employing Bayesian models, etc. In another aspect, the classical optimization process 202 can perform a set of machine learning computations to facilitate learning and/or generating inferences associated with data provided by the quantum amplitude estimation process 106. For example, the classical optimization process 202 can perform a set of clustering machine learning computations, a set of logistic regression machine learning computations, a set of decision tree machine learning computations, a set of random forest machine learning computations, a set of regression tree machine learning computations, a set of least square machine learning computations, a set of instance-based machine learning computations, a set of regression machine learning computations, a set of support vector regression machine learning computations, a set of k-means machine learning computations, a set of spectral clustering machine learning computations, a set of rule learning machine learning computations, a set of Bayesian machine learning computations, a set of deep Boltzmann machine computations, a set of deep belief network computations, and/or a set of different machine learning computations to facilitate learning and/or generating inferences associated with data provided by the quantum amplitude estimation process 106.

Figure 3:
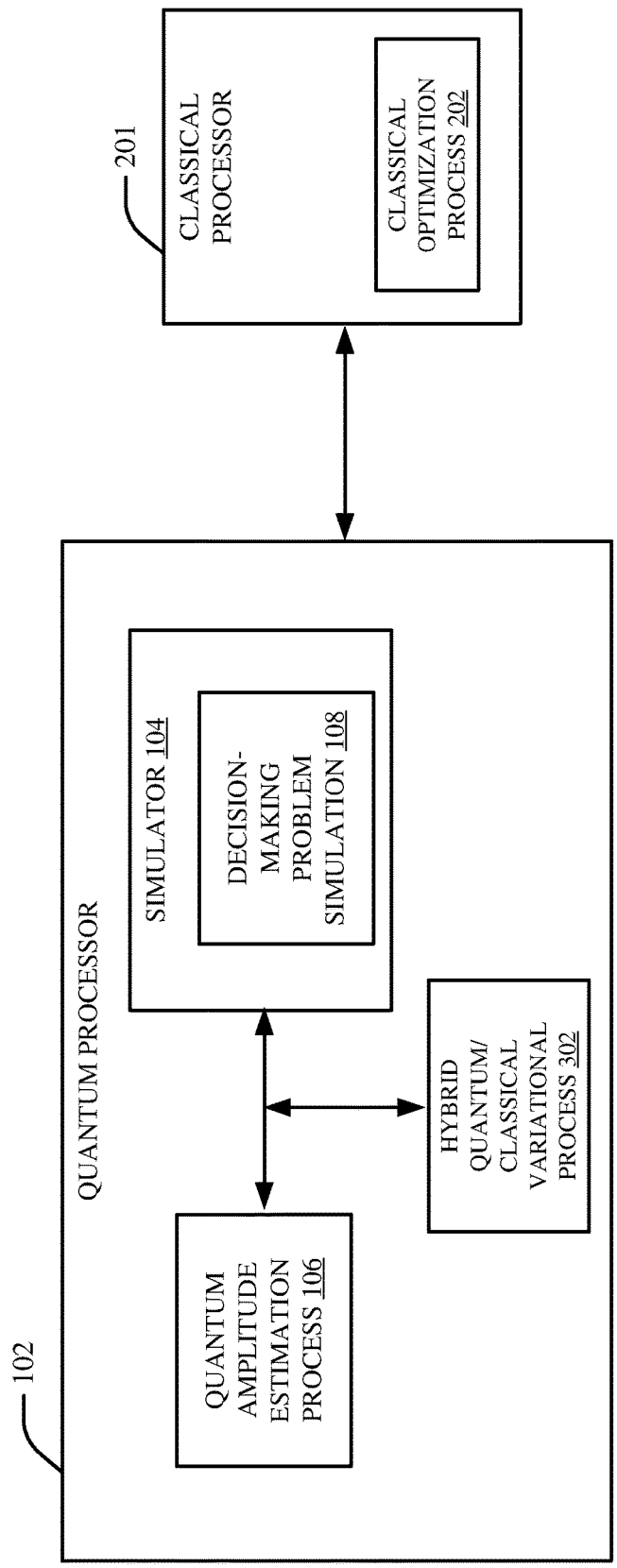
FIG. 3 illustrates a block diagram of yet another example, non-limiting system that facilitates simulation-based optimization on a quantum processor in accordance with one or more embodiments described herein.

FIG. 3 illustrates a block diagram of an example, non-limiting system 300 in accordance with one or more embodiments described herein. Repetitive description of like elements employed in other embodiments described herein is omitted for sake of brevity.

The system 300 can include the quantum processor 102 and the classical processor 201. In an embodiment, the quantum processor can include the simulator 104. The quantum processor 102 can also perform the quantum amplitude estimation process 106 and/or a hybrid quantum/classical variational process 302. Furthermore, the simulator 104 can perform the decision-making problem simulation 108. The classical processor 201 can perform the classical optimization process 202. The hybrid quantum/classical variational process 302 can employ a combination of quantum resources and classical resources to facilitate simulation-based optimization of data for the decision-making problem. For example, the hybrid quantum/classical variational process 302 can map continuous parameters for the decision-making problem to quantum states of the quantum processor 102. Furthermore, qubits of the quantum processor 102 can represent a superposition of discrete decisions for the decision-making problem. One or more other decisions for the decision-making problem can be determined by the classical processor 201 (e.g., the classical optimization process 202). Additionally or alternatively, a portion of a decision determined by the quantum processor 102 can be determined by the classical processor 201 (e.g., the classical optimization process 202). In an embodiment, the hybrid quantum/classical variational process 302 can employ a variational quantum eigensolver. For example, the classical processor 201 (e.g., the classical optimization process 202) can vary one or more parameters associated with the decision-making problem. The one or more parameters can, for example, control configuration of a quantum state associated with the quantum processor 102. The variational quantum eigensolver associated with the hybrid quantum/classical variational process 302 of the quantum processor 102 can prepare a quantum state associated with the one or more parameters. Furthermore, the variational quantum eigensolver associated with the hybrid quantum/classical variational process 302 of the quantum processor 102 can calculate a value and/or one or more properties of the quantum state. In an embodiment, the variational quantum eigensolver associated with the hybrid quantum/classical variational process 302 of the quantum processor 102 can comprise a variation form constructed with a plurality of layers. For example, a layer of the variational quantum eigensolver can comprise single-qubit rotations with one variational parameter per qubit to determine a rotation angle for a qubit. Furthermore, one or more additional layers of the variational quantum eigensolver can comprise one or more entangling gates, one or more controlled-Z gates applied to qubit pairs, and/or one or more single-qubit Y rotations.

Figure 4:
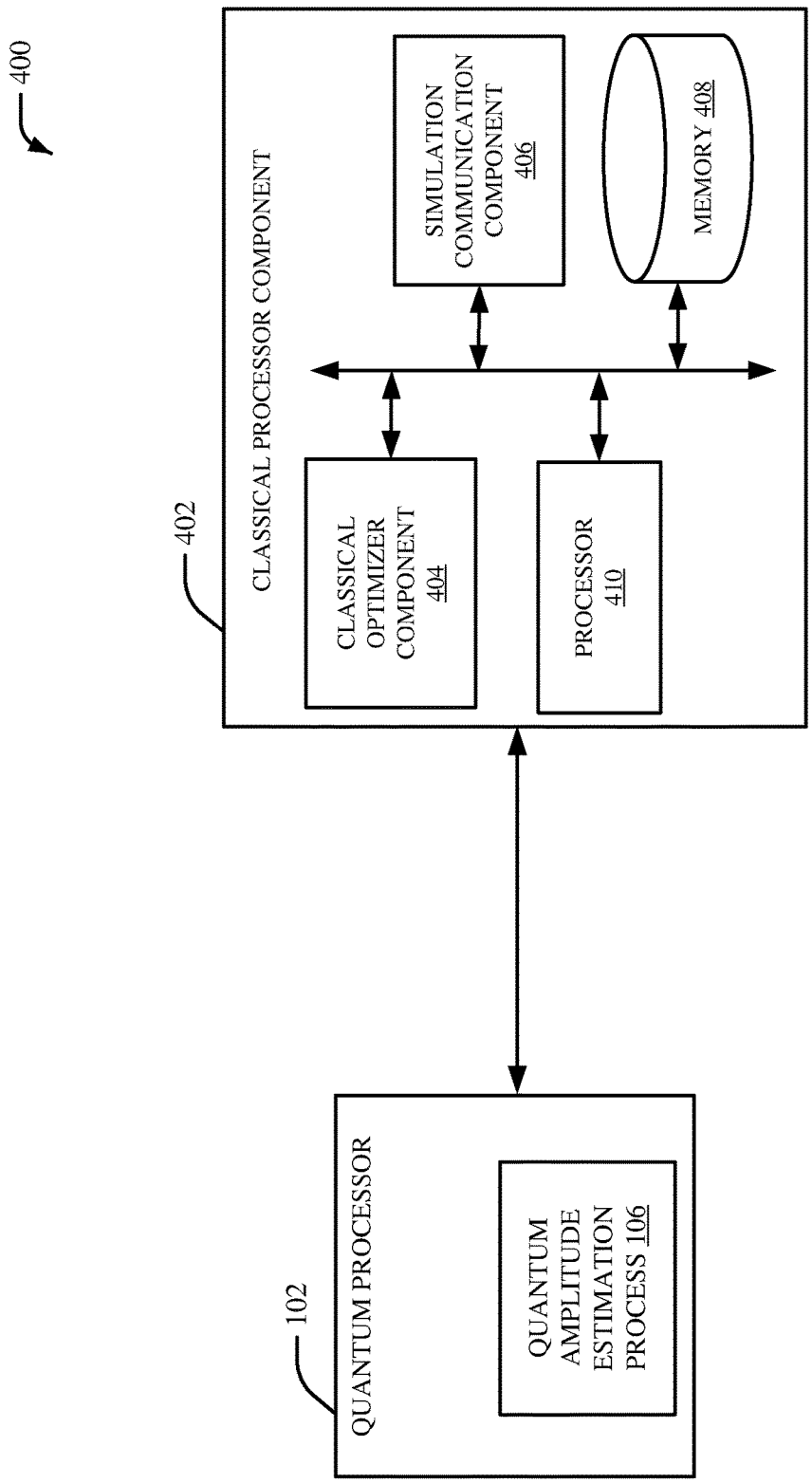
FIG. 4 illustrates a block diagram of an example, non-limiting system that includes a quantum processor and a classical processing component in accordance with one or more embodiments described herein.

FIG. 4 illustrates a block diagram of an example, non-limiting system 400 in accordance with one or more embodiments described herein. Repetitive description of like elements employed in other embodiments described herein is omitted for sake of brevity.

The system 400 can include the quantum processor 102 and a classical processor component 402. The quantum processor 102 can perform the quantum amplitude estimation process 106. Additionally or alternatively, in certain embodiments, the quantum processor 102 can perform the hybrid quantum/classical variational process 302. Additionally or alternatively, in certain embodiments, the quantum processor 102 can include the simulator 104 and/or the decision-making problem simulation 108. As shown in FIG. 4, the classical processor component 402 can include a classical optimizer component 404 and/or a simulation communication component 406. Aspects of the classical processor component 402 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the classical processor component 402 can also include memory 408 that stores computer executable components and instructions. Furthermore, the classical processor component 402 can include a processor 410 to facilitate execution of the instructions (e.g., computer executable components and corresponding instructions) by the classical processor component 402. As shown, the classical optimizer component 404, the simulation communication component 406, the memory 408 and/or the processor 410 can be electrically and/or communicatively coupled to one another in one or more embodiments. In an embodiment, the classical processor component 402 can be a classical processor (e.g., a classical computer, a classical circuit, etc.). For instance, the classical processor component 402 can correspond to the classical processor 201. In another embodiment, the classical processor component 402 can be a component of a classical processor (e.g., the classical processor 201). In yet another embodiment, the classical processor component 402 can be a component in communication with a classical processor.

The quantum processor 102 and the classical processor component 402 can be employed to provide a hybrid classical computing/quantum computing environment. For instance, the quantum processor 102 and the classical processor component 402 can be employed to perform one or more quantum computations associated with a quantum-variational architecture that employs quantum amplitude estimation. The quantum processor 102 can be a machine that performs a set of calculations based on principle of quantum physics. For instance, the quantum processor 102 can perform one or more quantum computations associated with a set of quantum gates. Furthermore, the quantum processor 102 can encode information using qubits. In an aspect, the quantum processor 102 can execute a set of instruction threads associated with the quantum amplitude estimation process 106. In another aspect, the quantum processor 102 can factorize data into a mathematical expression represented by a set of expected values and/or a set of trial states for the decision-making problem. A trial state can be a vector that can change by a scalar factor when a transformation (e.g., a linear transformation) is applied to the trial state. In certain embodiments, the quantum amplitude estimation process 106 of the quantum processor 102 can generate a set of quantum measurements associated with quantum amplitude estimation. For instance, the set of quantum measurements can include a set of samples determined by the quantum processor 102. Furthermore, in certain embodiments, the quantum processor 102 can provide the set of quantum measurements to the classical processor component 402 for optimization of the set of quantum measurements. In certain embodiments, data (e.g., the set of quantum measurements) provided by the quantum amplitude estimation process 106 can related to a decision-making problem associated with an artificial intelligence system, a machine learning system, a supply chain management system, a logistics system, a manufacturing system, a design system, a search engine system, an image recognition system, a speech recognition system, a model reduction system, an iterative linear solver system, a data mining system, a healthcare system, a pharmaceutical system, a biotechnology system, a finance system, a chemistry system, a material discovery system, a vibration analysis system, a geological system, an aviation system and/or another type of technical system.

The classical processor component 402 can be associated with a machine that performs a set of calculations based on binary digits and/or transistors. The classical processor component 402 (e.g., the classical optimizer component 404 and/or the simulation communication component 406 of the classical processor component 402) can receive data (e.g., the set of quantum measurements) from the quantum processor 102. For instance, the classical processor component 402 can be communicatively coupled to the quantum processor 102. In one example, the classical processor component 402 can be communicatively coupled to the quantum processor 102 via a wired communication channel. In another example, the classical processor component 402 can be communicatively coupled to the quantum processor 102 via a wireless communication channel. The classical optimizer component 404 can perform an optimization process associated with another portion of the quantum amplitude estimation process 106 to iteratively determine a parameter for the quantum amplitude estimation process 106 and/or a solution for the decision-making problem based on the data (e.g., the set of quantum measurements) received from the quantum processor 102. For instance, the classical optimizer component 404 can perform an optimization process associated with another portion of the quantum amplitude estimation process 106 to iteratively determine a variational parameterization for a trial state associated with the quantum processor 102. In an aspect, the classical optimizer component 404 can construct a parameter (e.g., a parameterized operator) for the quantum amplitude estimation process 106. The simulation communication component 406 can facilitate communication with the quantum processor 102. For example, the simulation communication component 406 can facilitate transmission of data between the quantum amplitude estimation process 106, the simulator 104, the decision-making problem simulation 108 and/or the hybrid quantum/classical variational process 302. In an embodiment, the simulation communication component 406 can transmit a parameter for the quantum amplitude estimation process 106 to the quantum processor 102. In another embodiment, the simulation communication component 406 can output the solution for the decision-making problem in response to a determination that the solution satisfied a defined criterion with a cost function and/or a classical optimization process associated with the classical optimizer component 404. In certain embodiments, the simulation communication component 406 can generate statistical data based on a classical optimization process associated with the classical optimizer component 404 and/or the data (e.g., the set of quantum measurements) received from the quantum processor 102. The statistical data can be indicative of an expected value related to the classical optimization process associated with the classical optimizer component 404 and/or the data (e.g., the set of quantum measurements) received from the quantum processor 102. In certain embodiments, the classical optimizer component 404 can determine a quantum state associated with the quantum processor 102 based on the data (e.g., the set of quantum measurements) received from the quantum processor 102. For instance, the classical optimizer component 404 can perform a classical optimization process associated with one or more classical optimization techniques to facilitate determination of a quantum state associated with the quantum processor 102. The quantum state can be, for example, data associated with the decision-making problem. In one example, the quantum state can include, for example, a set of quantum bits (e.g., a set of qubits) associated with the decision-making problem. In another example, the quantum state can include information associated with an x-component measurement, a y-component measurement and/or a z-component measurement associated with a state of a quantum bit of the quantum processor 102.

Figure 5:
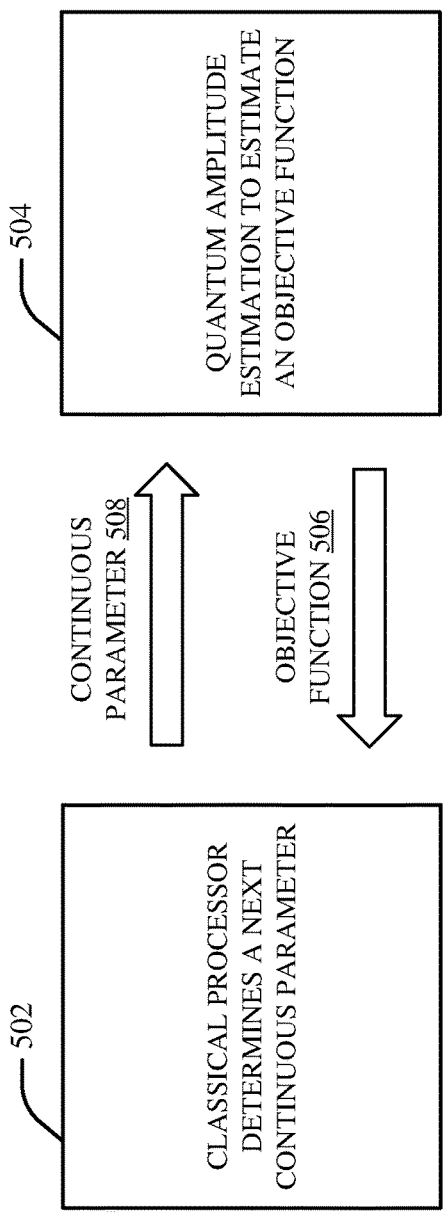
FIG. 5 illustrates an example, non-limiting system associated with simulation-based optimization on a quantum processor in accordance with one or more embodiments described herein.

FIG. 5 illustrates a block diagram of an example, non-limiting system 500 in accordance with one or more embodiments described herein. Repetitive description of like elements employed in other embodiments described herein is omitted for sake of brevity.

The system 500 includes a process 502 where a classical processor determines a next continuous parameter. The system 500 also includes a process 504 that employs quantum amplitude estimation to estimate an objective function. For example, the process 504 that employs quantum amplitude estimation can provide an objective function 506 to the process 502. The process 502 can employ the objective function 506 to provide a continuous parameter 508 to the process 504. In an embodiment, the process 502 can be performed by the classical processor 201, the classical optimization process 202 and/or the classical optimizer component 404 of the classical processor component 402. Additionally, in an embodiment, the process 504 can be performed by the quantum amplitude estimation process 106 of the quantum processor 102. The objective function 506 can be associated with the decision-making problem. For example, the objective function 506 can be a relational expression related to a combination of variables, values and/or symbols that describe the decision-making problem. In an embodiment, the process 504 can employ quantum amplitude estimation to estimate the objective function 506 (e.g., to estimate the objective function 506 with a reasonable accuracy). Furthermore, the process 502 can employ the classical optimizer to determine an optimal parameter (e.g., the continuous parameter 508) that maximizes or minimizes the objective function 506. As such, the process 504 can employ quantum amplitude estimation to determine a minimum value or a maximum value associated with the objective function 506 for the decision-making problem. In certain embodiments, classical constraints on the continuous parameter 508 can be incorporated into the classical optimizer associated with the process 502. Furthermore, in certain embodiments, the classical optimizer associated with the process 502 can be run until one or more termination criteria associated with the classical optimizer are met. For example, the classical optimizer associated with the process 502 can be run a certain number of instances, the classical optimizer associated with the process 502 can be run until the continuous parameter 508 meets a quality criterion, etc. In one example, the objective function 506 can be a loss function for a quantum computing process. In another example, the objective function 506 can be Hamiltonian value (e.g., a Hamiltonian data matrix) that encodes total energy of the quantum processor 102. The continuous parameter 508 can be a parameterized operator for quantum amplitude estimation. In an aspect, the continuous parameter 508 can be employed to simulate and/or optimize the decision-making problem. Additionally or alternatively, the continuous parameter 508 can be employed to optimize the quantum amplitude estimation associated with the decision-making problem. In one example, the continuous parameter 508 can be a parametrization of a quantum state associated with the quantum processor 102. For example, the continuous parameter 508 can be one or more values of one or more parameters that correspond to a quantum state associated with the quantum processor 102 in order to maximize or minimize the objective function 506.

Figure 6:
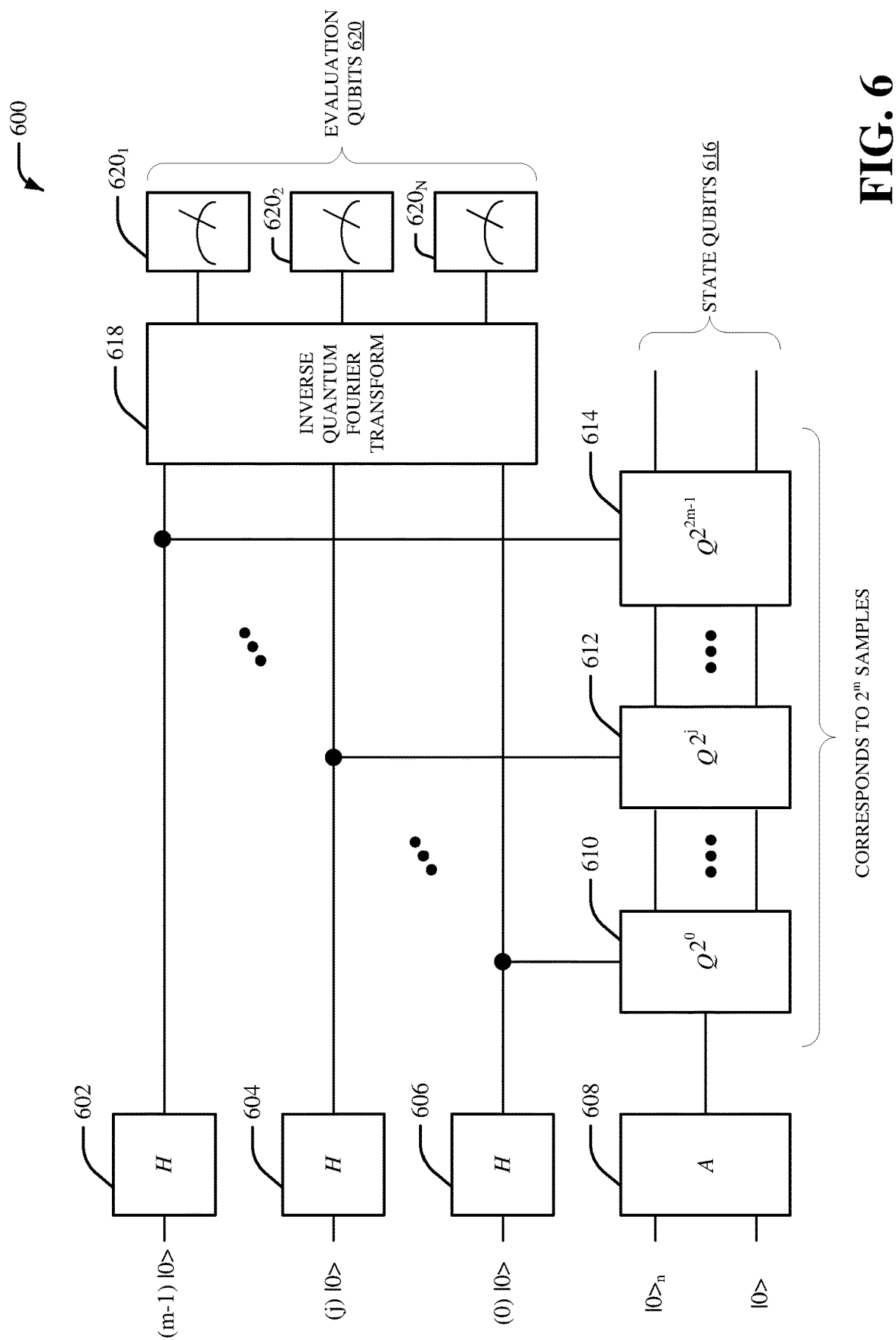
FIG. 6 illustrates an example, non-limiting system associated with quantum amplitude estimation in accordance with one or more embodiments described herein.

FIG. 6 illustrates a block diagram of an example, non-limiting system 600 in accordance with one or more embodiments described herein. Repetitive description of like elements employed in other embodiments described herein is omitted for sake of brevity.

The system 600 can represent a quantum amplitude estimation system that estimates an unknown parameter associated with the decision-making problem. For example, the system 600 can represent a quantum circuit associated with quantum amplitude estimation. The system 600 can include gate 602, a gate 604 and a gate 606. For example, the gate 602 can be a first Hadamard gate, the gate 606 can be a second Hadamard gate and the gate 606 can be a third Hadamard gate. The system 600 can also include an operator 608. The operator 608 can be an operator associated with a quantum sample. For instance, the operator 608 can be an operator A for a quantum sample (A). In an aspect, the operator 608 can be associated with one or more transformations. The operator 608 can provide $2^m$ samples where m is an integer. For example, the operator 608 can provide a sample 610, a sample 612 and a sample 614. In an aspect the $2^m$ samples (e.g., the sample 610, the sample 612 and/or the sample 614) can provide state qubits 616. The state qubits 616 can represent, for example, a qubit state value represented by a set of quantum bits (e.g., a set of qubits). In an example, state qubits 616 can include information associated with an x-component measurement, a y-component measurement and/or a z-component measurement associated with a state of the gate 602, the gate 604 and/or the gate 606. Values of the gate 602, the gate 604 and/or the gate 606 can be processed to an inverse quantum Fourier transform 618. For example, the inverse quantum Fourier transform 618 can be applied to the gate 602, the gate 604 and/or the gate 606 to provide a measurement for the gate 602, the gate 604 and/or the gate 606. In an aspect, the inverse quantum Fourier transform 618 can be applied to the gate 602, the gate 604 and/or the gate 606 to provide evaluation qubits 620 that includes a qubit measurement $620_1$, a qubit measurement $620_2$ and/or a qubit measurement $620_N$, where N is an integer. For instance, the qubit measurement $620_1$ can represent a first qubit measurement, the qubit measurement $620_2$ can represent a second qubit measurement, and the qubit measurement $620_N$ can represent an Nth qubit measurement.

Figure 7:
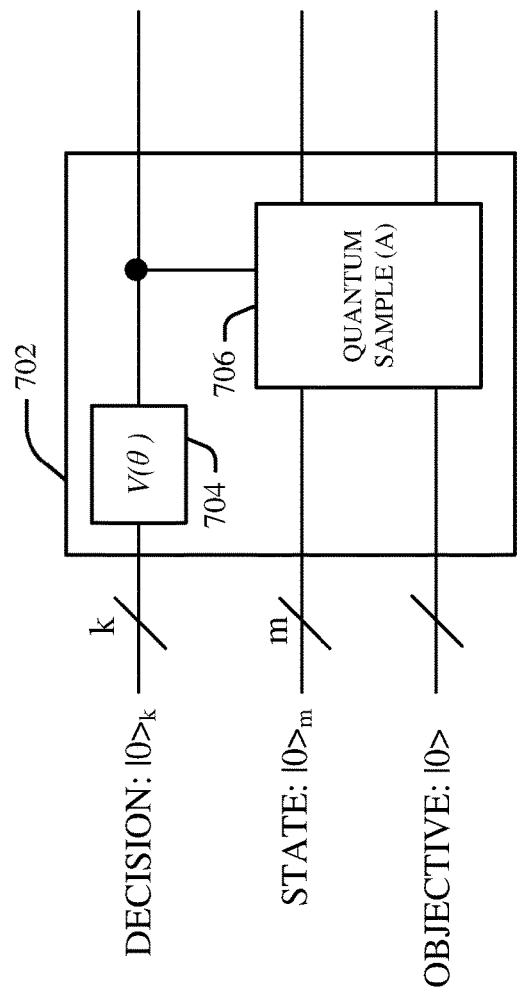
FIG. 7 illustrates another example, non-limiting system associated with quantum amplitude estimation in accordance with one or more embodiments described herein.

FIG. 7 illustrates a block diagram of an example, non-limiting system 700 in accordance with one or more embodiments described herein. Repetitive description of like elements employed in other embodiments described herein is omitted for sake of brevity.

The system 700 includes a quantum algorithm 702. The quantum algorithm 702 can include a variational form 704 and a quantum sample 706. In an embodiment, a binary optimization problem can be represented by $Y=\{0,1\}^k$, where k is a number of qubits. Binary decisions can be encoded in k qubits such that the k qubits control a portion of a simulation for the decision-making problem based on a state of the k qubits. The variational form can be parametrized by angles θ to determine a state of the k qubits. The quantum sample 706 can be, for example, a quantum sample (A) where A corresponds to an operator A associated with one or more transformations. For instance, the quantum sample 706 can be a quantum sample (A) where A corresponds to the operator 608. A number of samples m and/or an objective (e.g., an objective function) can be provided to the quantum sample 706 to facilitate determination of a state of the k qubits. In another embodiment, for a given angle θ, the quantum sample 706 can be employed to evaluate the decision-making problem. Furthermore, decision qubits and estimation qubits can be measured to provide improved simulation-based optimization. The decision-making problem can be a binary optimization problem. Alternatively, the decision-making problem can be a mixed binary optimization problem. In certain embodiments, the number of samples m can be adjusted throughout an optimization process to provide improved simulation-based optimization.

Figure 8:
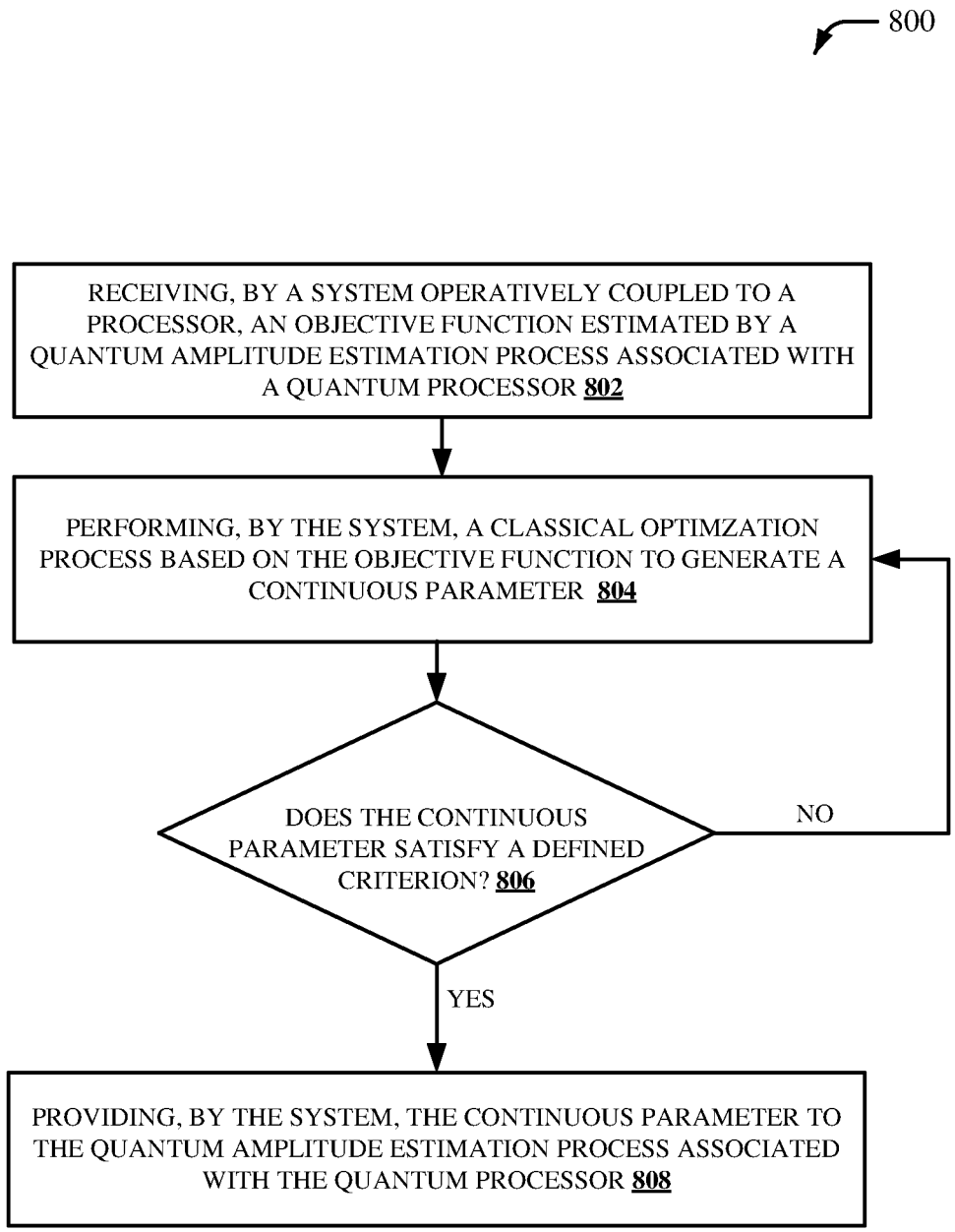
FIG. 8 illustrates a flow diagram of an example, non-limiting computer-implemented method for simulation-based optimization on a quantum computer in accordance with one or more embodiments described herein.

FIG. 8 illustrates a flow diagram of an example, non-limiting computer-implemented method 800 for simulation-based optimization on a quantum computer in accordance with one or more embodiments described herein. Repetitive description of like elements employed in other embodiments described herein is omitted for sake of brevity.

At 802, an objective function estimated by a quantum amplitude estimation process associated with a quantum processor is received by a system operatively coupled to a processor (e.g., by classical optimizer component 404). The objective function can be associated with a decision-making problem. For example, the objective function can be a relational expression related to a combination of variables, values and/or symbols that describe the decision-making problem. In an embodiment, the quantum amplitude estimation process can estimate a minimum value or a maximum value associated with the objective function for the decision-making problem. In one example, the objective function can be a loss function for a quantum computing process and/or the quantum amplitude estimation process. In another example, the objective function can be Hamiltonian value (e.g., a Hamiltonian data matrix) that encodes total energy of a quantum circuit associated with the quantum amplitude estimation process. The quantum amplitude estimation process can be, for example, a quantum algorithm that can achieve a quadratic speedup as compared to a classical algorithm. In an aspect, the quantum amplitude estimation process can be performed based on a probabilistic distribution associated with the decision-making problem. For example, the quantum amplitude estimation process can employ a probabilistic distribution of data associated with the decision-making problem. In certain embodiments, the quantum amplitude estimation process can sample a probabilistic distribution of data associated with a decision-making problem. For instance, parameters of the decision-making problem can be fit into an amplitude of a quantum state associated with a quantum processor. In another aspect, the quantum amplitude estimation process can estimate probability of success associated with a quantum search algorithm for the decision-making problem. The decision-making problem can be a maximization problem for a technological application. Alternatively, the decision-making problem can be a minimization problem for a technological application. A technological application associated with the decision-making problem can be a supply chain management application, a logistics application, a manufacturing application, a design application (e.g., a computer design application, a circuit design application, a product design application, etc.), a finance application, or another type of technological application.

At 804, a classical optimization process is performed, by the system (e.g., by classical optimizer component 404), based on the objective function to generate a continuous parameter. The continuous parameter can be a parameter for the quantum amplitude estimation process associated with the quantum processor. For example, the continuous parameter can be a parameterized operator for the quantum amplitude estimation process. In an aspect, the continuous parameter can be employed to simulate and/or optimize the decision-making problem. Additionally or alternatively, the continuous parameter can be employed to optimize the quantum amplitude estimation associated with the decision-making problem. In one example, the continuous parameter can be a parametrization of a quantum state associated with a quantum processor associated with the quantum amplitude estimation process. For example, the continuous parameter can be one or more values of one or more parameters that correspond to a quantum state associated with a quantum processor associated with the quantum amplitude estimation process in order to maximize or minimize the objective function. In an embodiment, the classical optimization process can be performed based on a type of decision variables associated with a decision-making problem simulated by the quantum processor and the classical optimization process. In another embodiment, the classical optimization process can be performed in response to a determination that a decision-making problem simulated by the quantum processor and the classical optimization process is associated with continuous decision variables. In yet another embodiment, the classical optimization process can be performed approximately in parallel to a hybrid quantum/classical variational process associated with the quantum processor.

At 806, it is determined (e.g., by classical optimizer component 404) whether the continuous parameter satisfies a defined criterion. For example, it can be determined whether the continuous parameter is an optimal continuous parameter for the quantum amplitude estimation process. Additionally or alternatively, it can be determined whether a termination criterion associated with the classical optimization process is satisfied. If no, the computer-implemented method 800 returns to 804. If yes, the computer-implemented method 800 proceeds to 808.

At 808, the continuous parameter is provided, by the system (e.g., by simulation communication component 406), to the quantum amplitude estimation process associated with the quantum processor. For example, the quantum amplitude estimation process can be updated based on the continuous parameter. In an embodiment, the quantum amplitude estimation process can generate a new objective function based on the continuous parameter. For instance, the quantum amplitude estimation process can update a previous version of the objective function based on the continuous parameter. In certain embodiments, the new objective function (e.g., the updated version of the objective function) can be employed to determine a next continuous parameter. In another embodiment, the new objective function (e.g., the updated version of the objective function) can be employed to provide an optimal solution (e.g., an optimal decision) for the decision-making problem.

In certain embodiments, the computer-implemented method 800 can additionally or alternatively include providing, by the system, the continuous parameter to the quantum amplitude estimation process associated with the quantum processor in response to a determination that the continuous parameter satisfies a defined parameter. In certain embodiments, the performing the classical optimization process can provide improved processing speed of the quantum processor.

Figure 9:
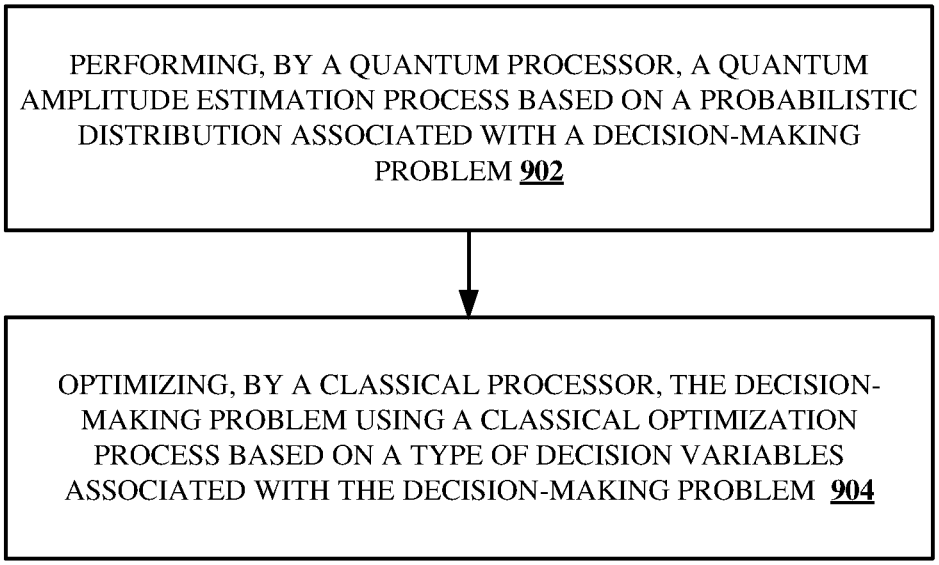
FIG. 9 illustrates a flow diagram of an example, non-limiting computer-implemented method for simulation-based optimization on a quantum computer in accordance with one or more embodiments described herein.

FIG. 9 illustrates a flow diagram of an example, non-limiting computer-implemented method 900 for simulation-based optimization on a quantum computer in accordance with one or more embodiments described herein. Repetitive description of like elements employed in other embodiments described herein is omitted for sake of brevity.

At 902, a quantum amplitude estimation process is performed, by a quantum processor (e.g., by quantum processor 102), based on a probabilistic distribution associated with a decision-making problem. In an embodiment, the quantum processor can employ a hybrid quantum/classical variational process to facilitate performing the quantum amplitude estimation process and/or simulating the decision-making problem. For example, the quantum processor can employ a variational quantum eigensolver to facilitate performing the quantum amplitude estimation process and/or simulating the decision-making problem.

At 904, the decision-making problem is optimized by a classical processor (e.g., by classical processor 201 and/or by classical processor component 402) using a classical optimization process based on a type of decision variables associated with the decision-making problem. In an embodiment, the classical processor can optimize the decision-making problem using the classical optimization process in response to a determination that the decision-making problem is associated with continuous decision variables.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Moreover, because at least performing a classical optimization process, etc. is established from a combination of electrical and mechanical components and circuitry, a human is unable to replicate or perform processing performed by the classical processor 201 and/or the classical processor component 402 (e.g., the classical optimizer component 404 and/or the simulation communication component 406) disclosed herein. For example, a human is unable to generate simulation data for a quantum circuit, etc.

Figure 10:
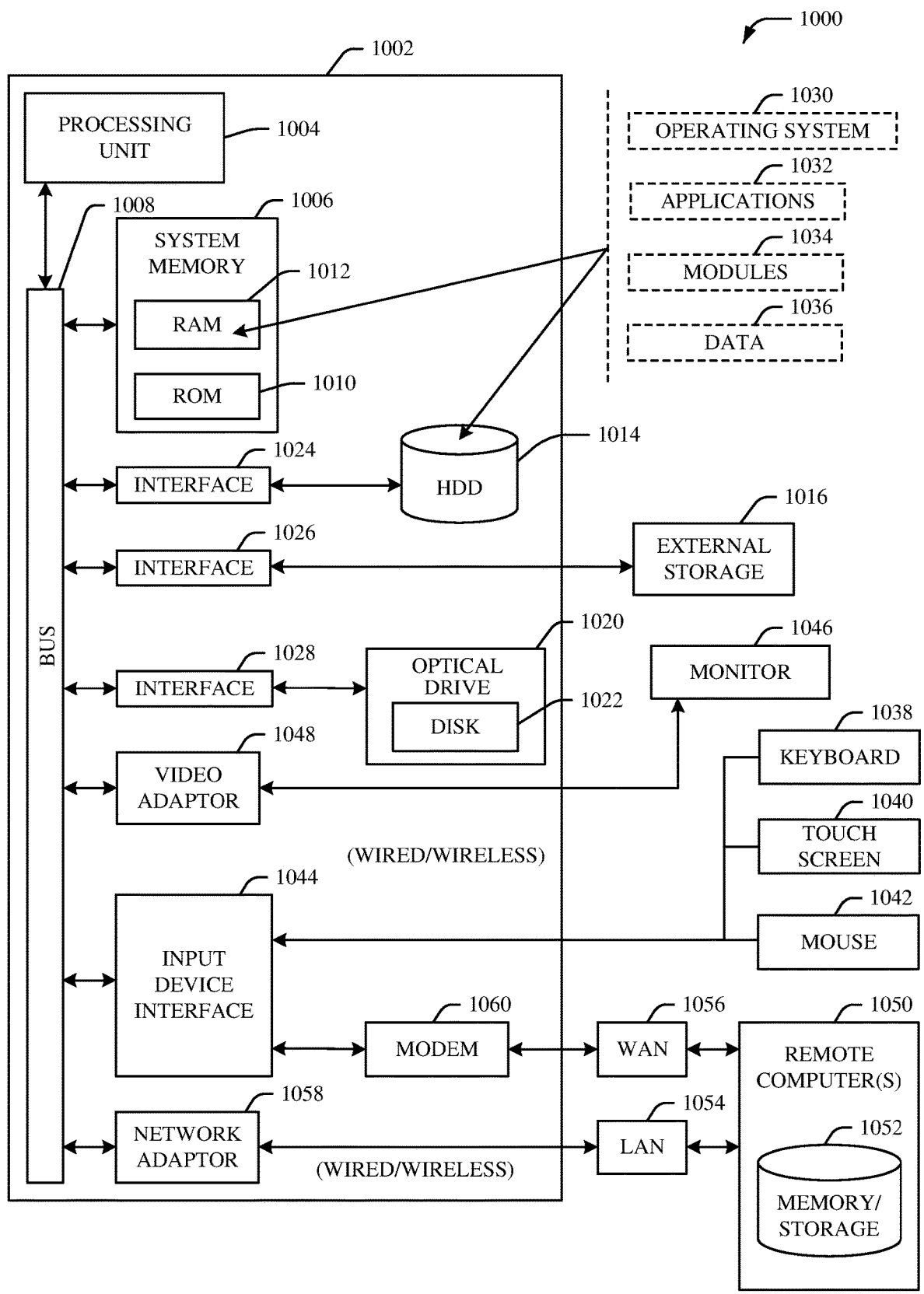
FIG. 10 illustrates a block diagram of an example, non-limiting operating environment in which one or more embodiments described herein can be facilitated.

In order to provide additional context for various embodiments described herein, FIG. 10 and the following discussion are intended to provide a general description of a suitable computing environment 1000 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 10, the example environment 1000 for implementing various embodiments of the aspects described herein includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes ROM 1010 and RAM 1012. A basic input/output system (BIOS) can be stored in a non-volatile memory such as ROM, erasable programmable read only memory (EPROM), EEPROM, which BIOS contains the basic routines that help to transfer information between elements within the computer 1002, such as during startup. The RAM 1012 can also include a high-speed RAM such as static RAM for caching data.

The computer 1002 further includes an internal hard disk drive (HDD) 1014 (e.g., EIDE, SATA), one or more external storage devices 1016 (e.g., a magnetic floppy disk drive (FDD) 1016, a memory stick or flash drive reader, a memory card reader, etc.) and an optical disk drive 1020 (e.g., which can read or write from a CD-ROM disc, a DVD, a BD, etc.). While the internal HDD 1014 is illustrated as located within the computer 1002, the internal HDD 1014 can also be configured for external use in a suitable chassis (not shown). Additionally, while not shown in environment 1000, a solid state drive (SSD) could be used in addition to, or in place of, an HDD 1014. The HDD 1014, external storage device(s) 1016 and optical disk drive 1020 can be connected to the system bus 1008 by an HDD interface 1024, an external storage interface 1026 and an optical drive interface 1028, respectively. The interface 1024 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. The systems and methods described herein can be implemented utilizing various commercially available operating systems or combinations of operating systems.

Computer 1002 can optionally comprise emulation technologies. For example, a hypervisor (not shown) or other intermediary can emulate a hardware environment for operating system 1030, and the emulated hardware can optionally be different from the hardware illustrated in FIG. 10. In such an embodiment, operating system 1030 can comprise one virtual machine (VM) of multiple VMs hosted at computer 1002. Furthermore, operating system 1030 can provide runtime environments, such as the Java runtime environment or the .NET framework, for applications 1032. Runtime environments are consistent execution environments that allow applications 1032 to run on any operating system that includes the runtime environment. Similarly, operating system 1030 can support containers, and applications 1032 can be in the form of containers, which are lightweight, standalone, executable packages of software that include, e.g., code, runtime, system tools, system libraries and settings for an application.

Further, computer 1002 can be enable with a security module, such as a trusted processing module (TPM). For instance with a TPM, boot components hash next in time boot components, and wait for a match of results to secured values, before loading a next boot component. This process can take place at any layer in the code execution stack of computer 1002, e.g., applied at the application execution level or at the operating system (OS) kernel level, thereby enabling security at any level of code execution.

A user can enter commands and information into the computer 1002 through one or more wired/wireless input devices, e.g., a keyboard 1038, a touch screen 1040, and a pointing device, such as a mouse 1042. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1004 through an input device interface 1044 that can be coupled to the system bus 1008, but can be connected by other interfaces, such as a parallel port, an IEEE 1394 serial port, a game port, a USB port, an IR interface, a BLUETOOTH® interface, etc.

A monitor 1046 or other type of display device can be also connected to the system bus 1008 via an interface, such as a video adapter 1048. In addition to the monitor 1046, a computer typically includes other peripheral output devices (not shown), such as speakers, printers, etc.

The computer 1002 can operate in a networked environment using logical connections via wired and/or wireless communications to one or more remote computers, such as a remote computer(s) 1050. The remote computer(s) 1050 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1052 is illustrated. The logical connections depicted include wired/wireless connectivity to a local area network (LAN) 1054 and/or larger networks, e.g., a wide area network (WAN) 1056. Such LAN and WAN networking environments are commonplace in offices and companies, and facilitate enterprise-wide computer networks, such as intranets, all of which can connect to a global communications network, e.g., the Internet.

When used in a LAN networking environment, the computer 1002 can be connected to the local network 1054 through a wired and/or wireless communication network interface or adapter 1058. The adapter 1058 can facilitate wired or wireless communication to the LAN 1054, which can also include a wireless access point (AP) disposed thereon for communicating with the adapter 1058 in a wireless mode.

When used in a WAN networking environment, the computer 1002 can include a modem 1060 or can be connected to a communications server on the WAN 1056 via other means for establishing communications over the WAN 1056, such as by way of the Internet. The modem 1060, which can be internal or external and a wired or wireless device, can be connected to the system bus 1008 via the input device interface 1044. In a networked environment, program modules depicted relative to the computer 1002 or portions thereof, can be stored in the remote memory/storage device 1052. It will be appreciated that the network connections shown are example and other means of establishing a communications link between the computers can be used.

When used in either a LAN or WAN networking environment, the computer 1002 can access cloud storage systems or other network-based storage systems in addition to, or in place of, external storage devices 1016 as described above. Generally, a connection between the computer 1002 and a cloud storage system can be established over a LAN 1054 or WAN 1056 e.g., by the adapter 1058 or modem 1060, respectively. Upon connecting the computer 1002 to an associated cloud storage system, the external storage interface 1026 can, with the aid of the adapter 1058 and/or modem 1060, manage storage provided by the cloud storage system as it would other types of external storage. For instance, the external storage interface 1026 can be configured to provide access to cloud storage sources as if those sources were physically connected to the computer 1002.

The computer 1002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a quantum processor;

a memory that stores computer executable components; and a classical processor that executes the computer executable components stored in the memory, wherein the computer executable components comprise:

a classical optimizer component that determines, using a classical optimization process, one or more parameters for a first portion of a quantum amplitude estimation process based on an objective function produced by the quantum amplitude estimation process; and wherein the quantum processor performs a second portion of the quantum amplitude estimation process, using the one or more parameters, based on a probabilistic distribution associated with a decision-making problem, wherein the quantum processor comprises a simulator that simulates the decision-making problem based on the quantum amplitude estimation process to generate an update to the objective function, wherein the simulator simulates the decision-making problem based on the quantum amplitude estimation process to improve performance of the simulator associated with the quantum processor.

2. The system of claim 1, wherein the simulator simulates the decision-making problem based on a type of decision variables associated with the decision-making problem.

3. The system of claim 1, wherein the classical optimization process is associated with continuous decision variables.

4. The system of claim 1, wherein the simulator simulates the decision-making problem using a classical processing technique for combinatorial optimization in response to a determination that the decision-making problem is associated with integer decision variables.

5. The system of claim 1, wherein the simulator simulates the decision-making problem using a hybrid quantum/classical variational process in response to a determination that the decision-making problem is associated with discrete decision variables.

6. The system of claim 1, wherein the simulator simulates the decision-making problem using a variational quantum eigensolver in response to a determination that the decision-making problem is associated with discrete decision variables.

7. The system of claim 1, wherein the simulator maps continuous decision variables associated with the decision-making problem to respective quantum states of the quantum processor.

8. A computer-implemented method, comprising:

estimating, by a system, via a quantum processor, using a first portion of a quantum amplitude estimation process, an objective function;

performing, by the system, via a classical processor operatively coupled to the quantum processor, a classical optimization process for a second portion of the quantum amplitude estimation process based on the objective function to generate a continuous parameter for a next estimation of the objective function by the first portion of the quantum amplitude estimation process, wherein the performing the classical optimization process comprises improving efficiency of a simulation associated with the quantum processor.

9. The computer-implemented method of claim 8, further comprising:

providing, by the system, the continuous parameter to the quantum amplitude estimation process associated with the quantum processor in response to a determination that the continuous parameter satisfies a defined parameter.

10. The computer-implemented method of claim 8, wherein the performing the classical optimization process comprises performing the classical optimization process based on a type of decision variables associated with a decision-making problem simulated by the quantum processor and the classical optimization process.

11. The computer-implemented method of claim 8, wherein the performing the classical optimization process comprises performing the classical optimization process in response to a determination that a decision-making problem simulated by the quantum processor and the classical optimization process is associated with continuous decision variables.

12. The computer-implemented method of claim 8, wherein the performing the classical optimization process comprises performing the classical optimization process approximately in parallel to a hybrid quantum/classical variational process associated with the quantum processor.

13. A system, comprising:

a quantum processor that performs a first portion of a quantum amplitude estimation process based on a probabilistic distribution associated with a decision-making problem to generate an objective function; and a classical processor, operatively coupled to the quantum processor, that optimizes a parameter for a next execution of the quantum amplitude estimation process using the objective function and a classical optimization process for a second portion of the quantum amplitude estimation process based on a type of decision variables associated with the decision-making problem, wherein the classical optimization process comprises improving efficiency of a simulation associated with the quantum processor.

14. The system of claim 13, wherein the classical processor optimizes the parameter using the classical optimization process in response to a determination that the decision-making problem is associated with continuous decision variables.

15. The system of claim 13, wherein the quantum processor employs a hybrid quantum/classical variational process to facilitate simulation of the decision-making problem.

16. The system of claim 13, wherein the quantum processor employs a variational quantum eigensolver to facilitate simulation of the decision-making problem.

17. The system of claim 13, wherein the quantum processor and the classical processor execute in an iterative loop until a defined criterion is satisfied.

18. The system of claim 13, wherein the quantum processor comprises a simulator that maps continuous decision variables associated with the decision-making problem to respective quantum states of the quantum processor.

* * * * *